United States Patent
Lee (10) Patent No.: US 8,291,580 B2
(45) Date of Patent: Oct. 23, 2012

(54) TAPE FEEDER FOR COMPONENT MOUNTER HAVING A PRESSURE-ACTIVATED DISCHARGE DOOR OPENING

(75) Inventor: Tae-Young Lee, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 459 days.

(21) Appl. No.: 12/582,894

(22) Filed: Oct. 21, 2009

(65) Prior Publication Data

US 2010/0101079 A1    Apr. 29, 2010

(30) Foreign Application Priority Data

Oct. 29, 2008  (KR) .................. 10-2008-0106480

(51) Int. Cl.
*B23P 19/00*    (2006.01)
*B65H 20/00*    (2006.01)

(52) U.S. Cl. ........................................ 29/806; 226/122

(58) Field of Classification Search .............. 29/700, 29/743, 806, 739, 759, 563; 226/122, 139, 226/162, 88, 181; 493/464
See application file for complete search history.

(56) References Cited

U.S. PATENT DOCUMENTS

| | | | | |
|---|---|---|---|---|
| 5,989,176 A | * | 11/1999 | Ratzel et al. | 493/464 |
| 7,448,130 B2 | | 11/2008 | Choi et al. | |
| 2008/0035697 A1 | * | 2/2008 | Kim | 226/88 |
| 2009/0031562 A1 | | 2/2009 | Choi et al. | |

FOREIGN PATENT DOCUMENTS

| | | |
|---|---|---|
| EP | 0 602 626 A2 | 6/1994 |
| JP | 04-066461 A | 3/1992 |
| JP | 07-226599 A | 8/1995 |
| JP | 2002-368485 A | 12/2002 |
| JP | 2003-188581 A | 7/2003 |
| KR | 1020040005653 A | 1/2004 |
| KR | 1020070039322 A | 4/2007 |

* cited by examiner

*Primary Examiner* — John C Hong
(74) *Attorney, Agent, or Firm* — Drinker Biddle & Reath LLP

(57) ABSTRACT

A tape feeder for supplying components to a component mounter via a carrier tape on which the components are disposed at predetermined intervals, wherein the carrier tape and components are covered with a cover tape, is described. The tape feeder may comprise a frame including a receptacle. The receptacle may have an inlet port for receiving the cover tape separated from the carrier tape, a space for containing the cover tape received through the inlet port, and a door opening through which the cover tape is discharged. The tape feeder may additionally comprise a door configured to open or close the door opening and an opening/closing member configured to fasten the door closed and thereafter open the door when an inner pressure of at least a predetermined value is applied by the cover tape received in the receptacle.

8 Claims, 9 Drawing Sheets

TAPE FEEDER FOR COMPONENT MOUNTER HAVING A PRESSURE-ACTIVATED DISCHARGE DOOR OPENING

CROSS-REFERENCE TO RELATED APPLICATION

This application claims the priority benefit of Korean Patent Application No. 2008-0106480, filed Oct. 29, 2008, which is hereby incorporated herein by reference in its entirety.

BACKGROUND

1. Field of the Invention

The present invention relates to a tape feeder for a component mounter, and more particularly, to a tape feeder for a component mounter including a receptacle having a space for receiving a cover tape separated from a carrier tape, the receptacle having a door which is configured to open when the is received cover tape applies an inner pressure at a predetermined value or higher.

2. Description of the Related Art

Typically, cartridge-type tape feeders are installed at component mounters to supply components, which may include semiconductor chips, to the component mounters. A tape feeder may be classified in different classifications, for example 6 mm, 12 mm, or 18 mm, depending on a width of a tape feeder's tape.

The component mounter (e.g., chip mounter) is a device for mounting the components supplied from the tape feeder onto a printed circuit board in certain positions and in various ways. The component mounter may receive various kinds of components to be mounted on the printed circuit board from the tape feeder and may mount the components on the printed circuit board using a suction nozzle operated by a robot.

When a size of the components mounted on the printed circuit board is relatively large, the components are typically loaded on a tray and then supplied to the component mounter. However, when the size of the components is relatively small, the components are likely to be separated from a designated position and be lost or damaged during conveyance to or installation by the component mounter. Therefore, the tape feeder is typically used to supply the relatively small components to the component mounter.

The tape feeder typically employs a tape reel on which a carrier tape and a cover tape are wound. Relatively small components are typically attached to a surface of the carrier tape at predetermined intervals, and the cover tape is typically deposited on the carrier tape and the components to protect the components. In addition, the tape feeder typically strips the cover tape from the carrier tape wound on the tape reel and supplies the components disposed at predetermined intervals into the component mounter.

The component mounter typically uses the suction nozzle operated by the robot to pick up the components after the cover tape has been stripped from the carrier tape. The component mounter then conveys the components and mounts them on the printed circuit board.

A tape feeder as described above is disclosed in Korean Patent Laid-open Publication No. 2007-39322, U.S. Pat. No. 7,448,130 entitled "Tape Feeder for Component Mounter Providing Stable Tape Feeding" and filed on Feb. 13, 2006, and U.S. patent application Ser. No. 12/247,277 entitled "Tape Feeder for Component Mounter Providing Stable Tape Feeding and Method for Mounting a Component on a Circuit Board with Component Mounter" and filed on Oct. 8, 2008, each of which are hereby incorporated herein by reference. In the tape feeder described in the referenced patent applications and publications, a sprocket is coupled to a latch gear to be coupled to a frame of the tape feeder on a same axis. In addition, the latch gear includes a rotary lever rotatably installed at the same axis, and a plurality of links and drive cylinders for operating the rotary lever.

Further, a push pawl is installed at the rotary lever by a torsion spring to be separated from teeth upon forward movement by the link, and inserted into the teeth upon backward movement to rotate the latch gear to a certain angle. In addition, a stop pawl is rotatably installed at the frame so that the rotation of the latch gear can be stopped at a position rotated by the push pawl. A spring is also installed at the stop pawl to provide resiliency to adhere the stop pawl to the teeth of the latch gear.

Therefore, as the link moves back and forth, the push pawl rotates the latch gear to a certain angle, and the stop pawl advances over prominences and moves from one recession to another among the teeth of the latch gear.

The sprocket is rotated with rotation of the latch gear to move the tape forward one step at a time to strip the cover tape located thereon to discharge the cover tape backward. A first rotary body and a second rotary body engaged with the first rotary body are installed behind the latch gear to interpose the cover tape between the rotary bodies and discharge the cover tape through rotation of the first and second rotary bodies. A receptacle may be installed to receive the cover tape discharged through rotation of the first and second rotary bodies.

SUMMARY

A tape feeder for supplying components to a component mounter via a carrier tape on which the components are disposed at predetermined intervals wherein the carrier tape and components are covered with a cover tape is described. The tape feeder may comprise a frame including a receptacle. The receptacle may have an inlet port for receiving the cover tape separated from the carrier tape and a space for containing the cover tape received through the inlet port.

In one embodiment, the receptacle may also comprise a first door opening through which the cover tape is discharged. The tape feeder may additionally comprise a first door configured to open or close the first door opening. The tape feeder may also comprise an opening/closing member configured to fasten the first door closed and thereafter open the first door when an inner pressure of at least a fastening force is applied by the cover tape received in the receptacle.

In another embodiment, the receptacle may also comprise a first door opening through which the cover tape is discharged and a second door opening through which the cover tape is discharged. The tape feeder may additionally comprise a first door configured to open or close the first door opening, a second door configured to open or close the second door opening and disposed to form an angle of less than 180 degrees with respect to the first door, and a fastening member coupled to the frame. The fastening member may be configured to fasten both the first and second doors closed, open the first door when the cover tape received in the receptacle applies an inner pressure greater than a first fastening force directed to the first door, and open the second door when the cover tape received in the receptacle applies an inner pressure greater than a second fastening force directed to the second door.

In yet another embodiment, the receptacle may also comprise a first door opening through which the cover tape is discharged and a second door opening through which the cover tape is discharged. The tape feeder may additionally comprise a first door configured to open or close the first door opening, a second door configured to open or close the second door opening and disposed to form an angle of less than 180 degrees with respect to the first door, and a fastening member coupled to the second door. The fastening member may be configured to fasten the first door and simultaneously open the first and second doors when one of an inner pressure directed to the first door and an inner pressure directed to the second door is greater than a fastening force. The inner pressure may be applied by the cover tape received in the receptacle.

In a further embodiment, the receptacle may also comprise a first door opening through which the cover tape is discharged. The tape feeder may additionally comprise a first door configured to open or close the first door opening, a pressure sensor installed at the receptacle and configured to detect a pressure applied by the cover tape, and a locking member configured to lock the first door closed. The locking member may be configured to thereafter open the first door when the pressure detected by the pressure sensor is higher than a predetermined value.

DETAILED DESCRIPTION

Figure 1:
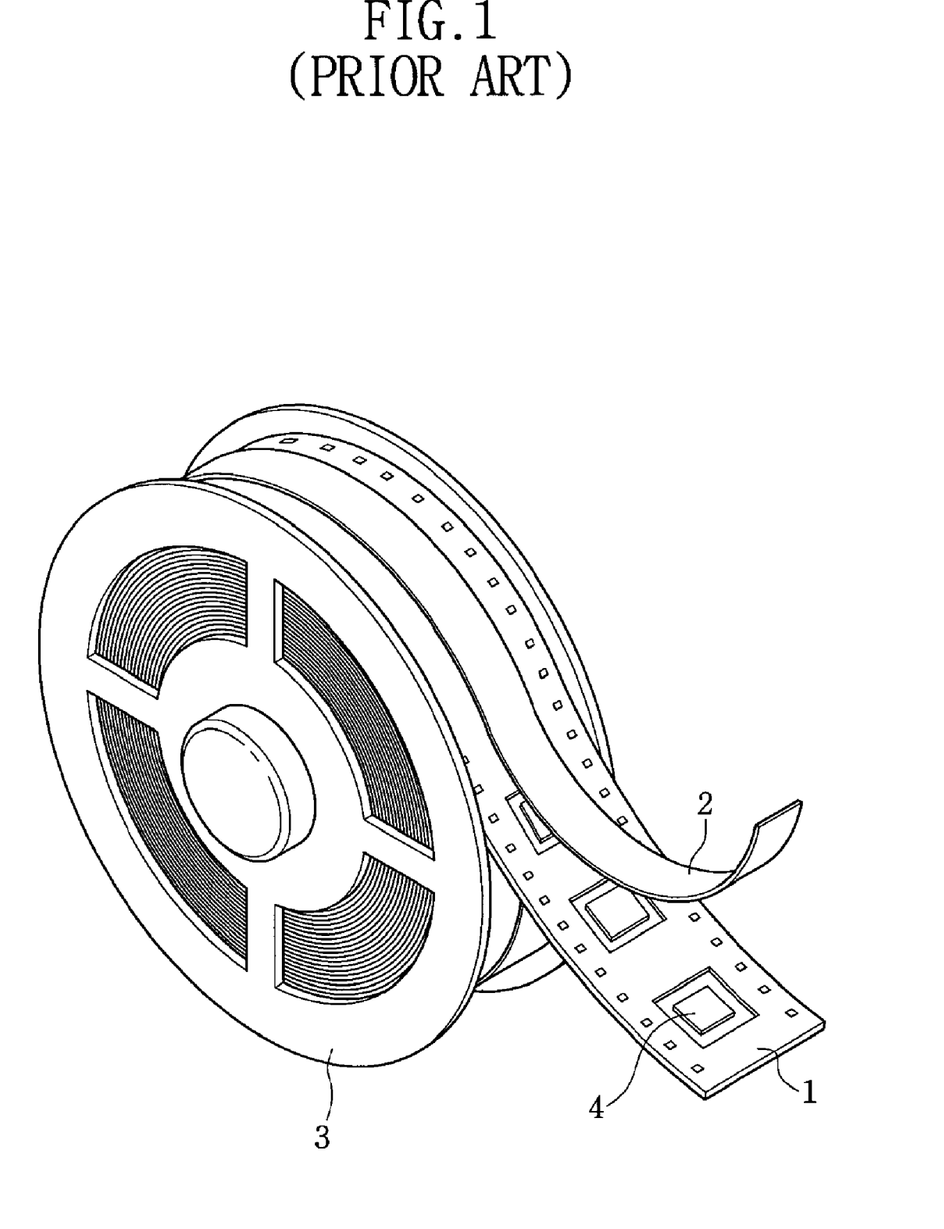
FIG. 1 is a perspective view of an exemplary tape reel for a tape feeder.

FIG. 1 is a perspective view of an exemplary tape reel 3 for a tape feeder. A carrier tape 1 may have an accommodating part in which components 4 are accommodated at predetermined intervals. A cover tape 2 may be disposed on the carrier tape 1 to cover and protect the components 4. The carrier tape 1 and the cover tape 2, between which the components 4 are accommodated, may be wound on the tape reel 3.

Figure 2:
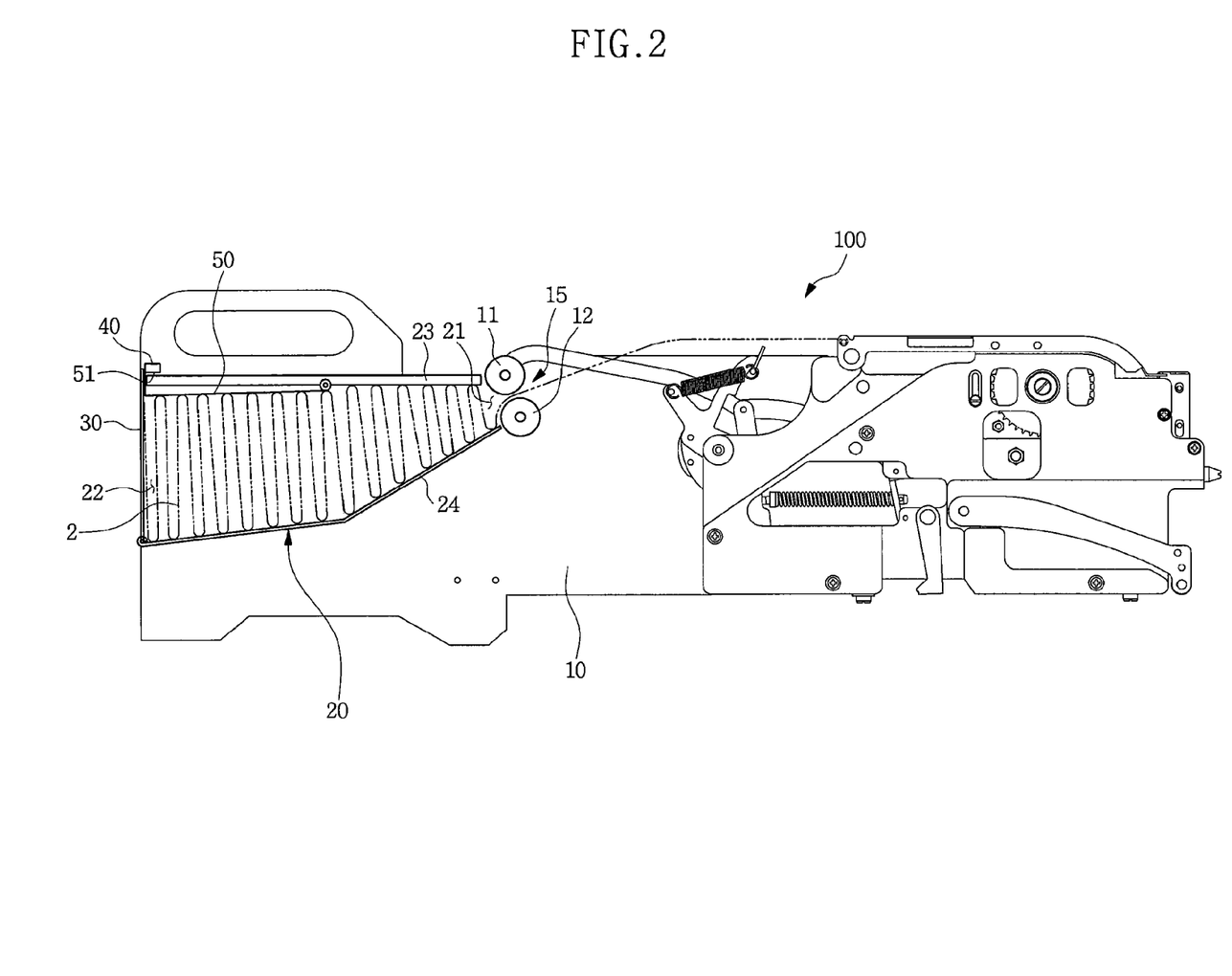
FIG. 2 is a side view of a first exemplary tape feeder showing a receptacle thereof.
Figure 3:
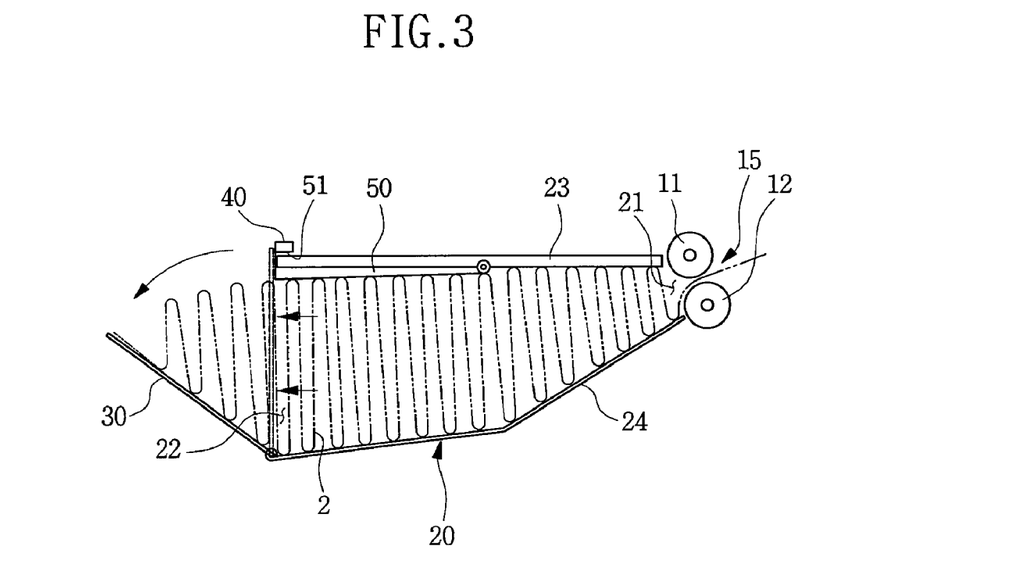
FIGS. 3 and 4 are views showing open and closed states of the first exemplary tape feeder.
Figure 4:
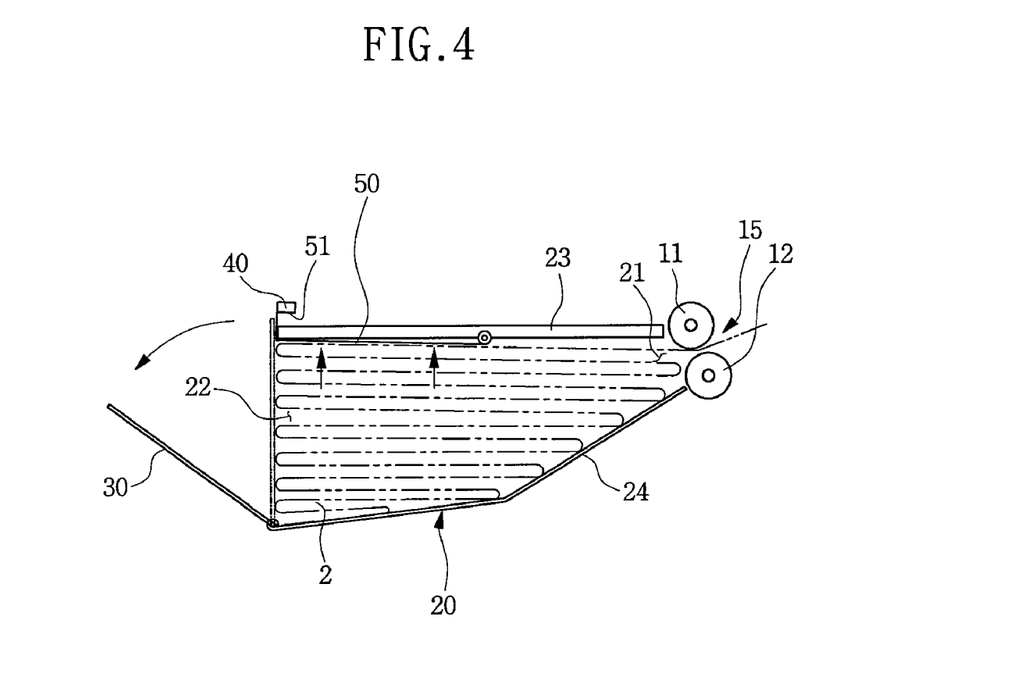

FIG. 2 is a side view of a first exemplary tape feeder 100 showing a receptacle 20 thereof. FIGS. 3 and 4 are views showing open and closed states of the first exemplary tape feeder 100. The tape feeder 100 may have installed therein the carrier tape 1 from which the tape feeder 100 receives the components 4. The tape feeder 100 may include a frame 10 having a discharge passage 15 for the cover tape 2, and at least one rotary body installed at one side of the frame 10 to supply the components 4 from the carrier tape 1 and then discharge the cover tape 2 backward. The at least one rotary body of the first exemplary tape feeder 100 may include a first rotary body 11 and a second rotary body 12 engaged with the first rotary body 11 to discharge the cover tape 2.

The receptacle 20 having a predetermined space may be disposed at a position at which the cover tape 2 is discharged by the first and second rotary bodies 11 and 12. The receptacle 20 may have a space with a width larger than a width of the carrier tape 1 or the cover tape 2. In addition, an upper sidewall 23 may be formed at an upper part of the receptacle 20, and a lower sidewall 24 may be formed at a lower part of the receptacle 20, to provide the predetermined space therebetween.

The tape feeder 100 may make possible an exchange of multiple tape reels 3 in order to provide a continuous supply of the components 4 by the tape feeder 100 and prevent interruption of the supply thereof. The exchange of the multiple tape reels 3 may include connecting a front end of a newly supplied carrier tape 1 and cover tape 2 to a rear end of a previously supplied carrier tape 1 and cover tape 2.

For this reason, the cover tape 2 may be continuously folded in the is receptacle 20. The receptacle 20 may include an inlet port 21 into which the cover tape 2 is introduced by the first and second rotary bodies 11 and 12, and a discharge port 22 through which the cover tape 2 is discharged when the receptacle 20 is filled with a certain amount of the cover tape 2.

The receptacle 20 may additionally include a first door 30 which opens and closes the discharge port 22 when receptacle 20 is substantially filled with the cover tape 2. The first door 30 may include or be formed of a metal material or a synthetic resin material. The first door 30 may be hinged at one side to the lower sidewall 24 of the receptacle 20 in order to open and close the discharge port 22. The first door 30 may be pivotally coupled to the frame 10 which constitutes the receptacle 20.

Further, an opening/closing member may automatically open and close the first door 30 depending on an inner pressure caused by the cover tape 2 which is received in the receptacle 20. The pressure caused by the cover tape 2 may be dependent upon an amount of the cover tape 2 which is received in the receptacle 20. The opening/closing member may include a lever 50 coupled to a sidewall of the receptacle 20 at one end of the lever 50, and a fastening member 40 disposed at the other end of the lever 50. The fastening member 40 may fasten the first door 30 to the discharge port 22.

The lever 50 may have both ends vertically bent upward to have different lengths. A long end of the lever 50 may be hinged to the inner upper sidewall 23 of the receptacle, and a short end of the lever 50 may be coupled to the fastening member 40. The fastening member 40 may determine an inner is pressure caused by the cover tape 2 in the receptacle 20 which is necessary for opening the first door 30.

The short end of the lever 50 may pass between the first door 30 and the discharge port 22 of the receptacle 20 to be exposed to the exterior of the receptacle 20 and coupled to the fastening member 40. The fastening member 40 may couple to the lever 50 with a certain force such that the first door 30 may remained closed until the inner pressure caused by the cover tape 2 meets or exceeds the certain force.

In order to prevent sagging of the lever 50 due to the weight of the lever 50 and the fastening member 40, a locking member 51 may project from an end of the short end of the lever 50 to be locked by the upper sidewall 23 adjacent to the discharge port 22. The lever 50 may typically be hooked by the upper sidewall 23 adjacent to the discharge port 22 at a corner of the discharge port 22 using the locking member 51 due to the weight of the lever 50. The lever 50 may be spaced apart from an inner surface of the upper sidewall 23 of the receptacle 20 due to the weight of the lever 50. In addition, when a certain pressure is applied by the cover tape 2 upward against the lever 50, the lever 50 may be rotated upward such that the short end of the lever 50 separates the fastening member 40 from the first door 30 and opens the first door 30.

The fastening member 40 may include a permanent magnet to provide a constant fastening force. In order to provide the fastening force corresponding to the permanent magnet, the first door 30 may include iron or a magnetic body, or may include a fastening block formed of iron or a magnetic body disposed at a position corresponding to the permanent magnet. In some embodiments, the is fastening member 40 may include a fabric hook-and-loop fastener tape (e.g., VELCRO) fastened to the first door 30 and the lever 50, respectively. In additional embodiments, the fastening member 40 may include dot (snap) buttons.

Hereinafter, operation of the first exemplary tape feeder 100 will be described with reference to FIGS. 1 through 4. Description of basic operations of the tape feeder 100 will be omitted and discharge of the cover tape 2 will be described in detail.

First, the tape feeder 100 may supply components 4 and separate the cover tape 2 from the carrier tape 1. As the components 4 are supplied, the cover tape 2 separated from the carrier tape 1 may pass through the discharge passage 15 to be received in the receptacle 20 via the first and second rotary bodies 11 and 12. The cover tape 2 may be folded in a vertical zigzag manner as shown in FIG. 3, or be folded in a lateral zigzag manner as shown in FIG. 4.

As the cover tape 2 received in the receptacle 20 fills the predetermined space therein, an increased inner pressure of the receptacle caused by the cover tape 2 may prevent or cause errors with reception of the cover tape 2 from the first and second rotary bodies 11 and 12 through the inlet port 21. When the cover tape 2 is substantially folded in a vertical zigzag manner as shown in FIG. 3, the cover tape 2 may apply a certain inner pressure to the first door 30. While there is also a pressure applied upward and downward, the upward and downward pressure is typically smaller than the pressure applied to the first door 30.

When the inner pressure applied to the first door 30 is larger than a fastening force by which the first door 30 is fastened with the fastening member 40, the inner pressure applied to the first door 30 may overcome the fastening force of the fastening member 40 to open the first door 30. After the first door 30 is opened, the cover tape 2 received in the receptacle 20 may be automatically discharged to the exterior of the receptacle 20. An operator may recognize that the first door 30 is opened, rapidly remove the cover tape 2 received in the receptacle 20, and then close the first door 30.

When the cover tape 2 is substantially folded in a lateral zigzag manner as shown in FIG. 4, the cover tape 2 may apply a certain inner pressure in a direction other than that of the inner pressure applied to the first door 30. While there may be a pressure applied laterally (i.e., rightward and leftward), the lateral pressure may be smaller than the pressure applied in a vertical direction. The lateral pressure may not be sufficient to overcome the fastening force of the fastening member 40 to open the first door 30. However, the vertically applied inner pressure of the cover tape 2 may raise the lever 50. Consequently, the raised lever 50 may overcome the fastening force of the fastening member 40 to separate the fastening member 40 from the first door 30. Thereafter, the cover tape 2 received in the receptacle 20 may be automatically discharged to the exterior of the receptacle 20. An operator may recognize that the first door 30 has opened, rapidly remove the cover tape 2 received in the receptacle 20, and then close the first door 30.

Figure 5:
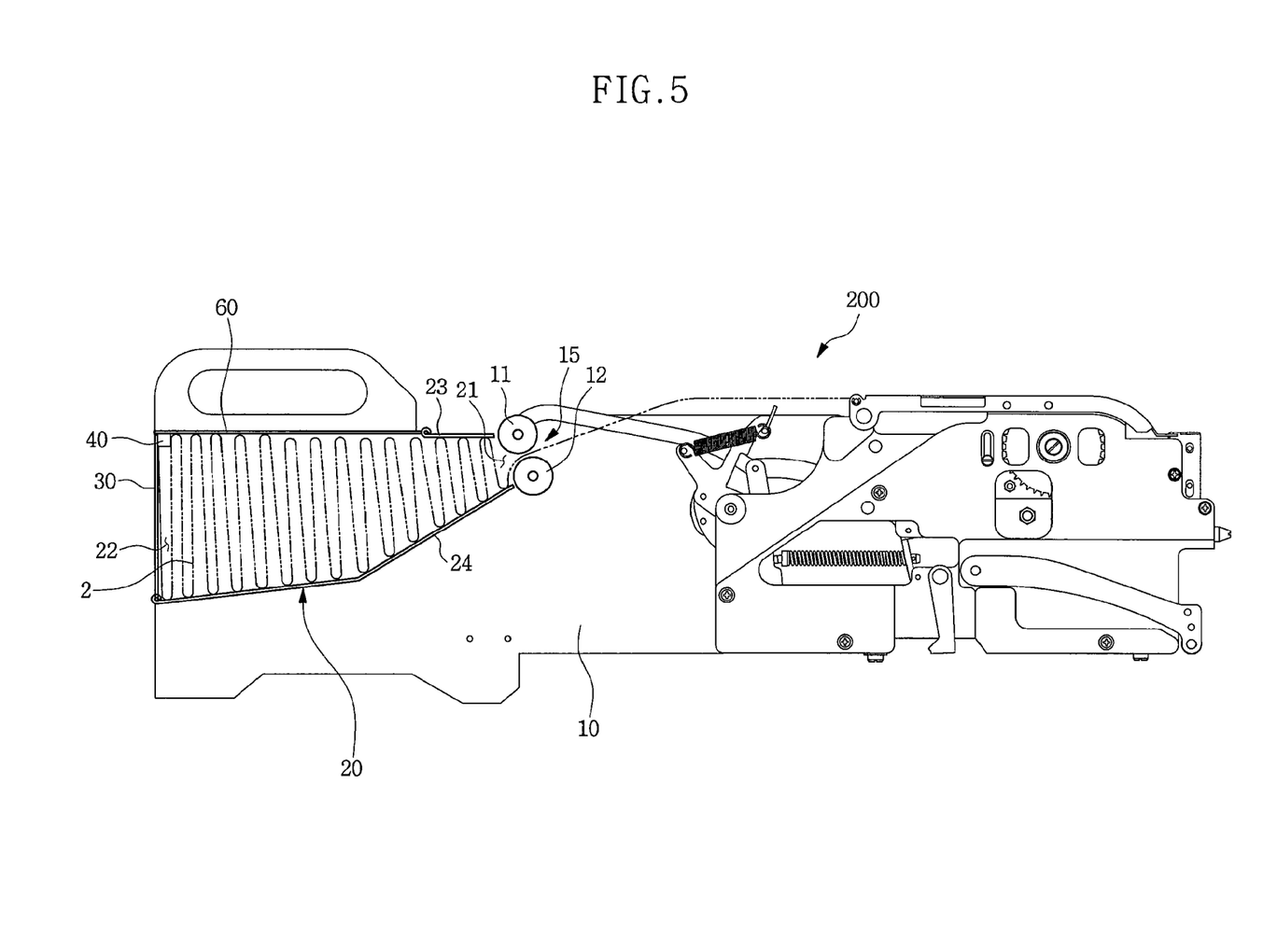
FIG. 5 is a side view of a second exemplary tape feeder showing a receptacle thereof.
Figure 6:
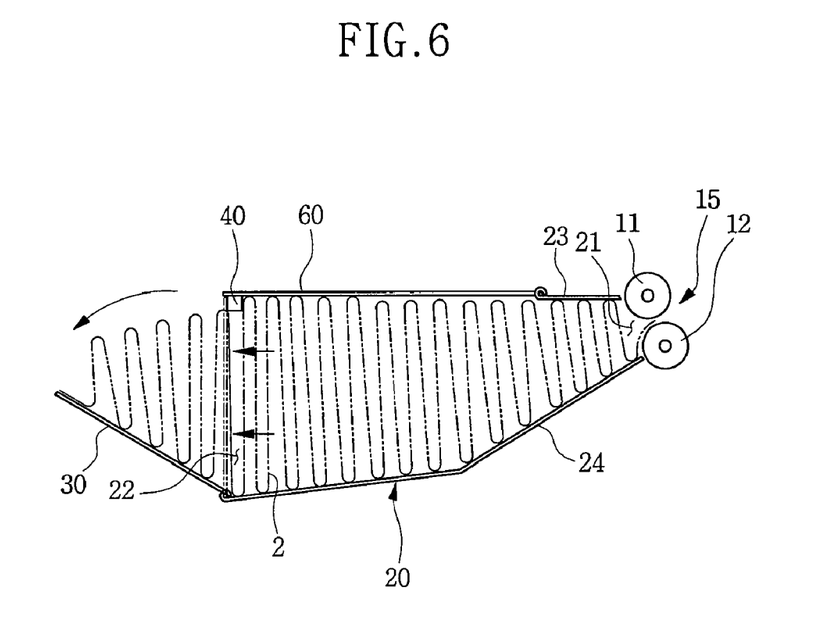
FIGS. 6 and 7 are views showing open and closed states of the second exemplary tape feeder.
Figure 7:
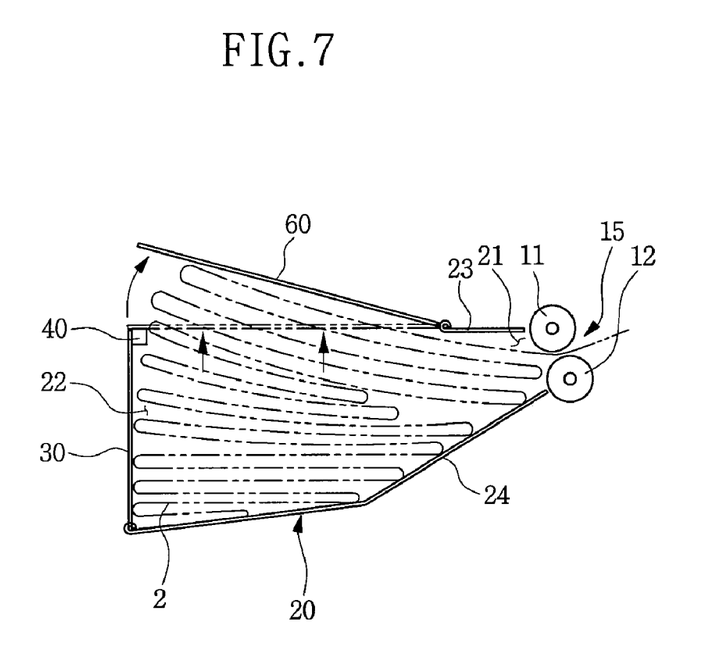

Hereinafter, a second exemplary tape feeder 200 will be described with reference to FIGS. 5 through 7. FIG. 5 is a side view of the second exemplary tape feeder 200 showing a receptacle thereof. FIGS. 6 and 7 are views showing open and closed states of the second exemplary tape feeder 200.

The tape feeder 200 may include a first door 30 and a second door 60. The tape feeder 200 may also include a fastening member 40 installed at a frame 10 which simultaneously fastens the first and second doors 30 and 60.

A receptacle 20 having a predetermined space may be provided at a position in which a cover tape 2 is discharged by first and second rotary bodies 11 and 12. The receptacle 20 may have a space with a width larger than a width of the carrier tape 1 or the cover tape 2. In addition, an upper sidewall 23 may be formed at an upper part of the receptacle 20, and a lower sidewall 24 may be formed at a lower part of the receptacle 20 to provide the predetermined space therebetween.

The receptacle 20 may include an inlet port 21 into which the cover tape 2 is introduced by the first and second rotary bodies 11 and 12, and a discharge port 22 through which the cover tape 2 is discharged when the receptacle 20 is filled with a certain amount of the cover tape 2.

The receptacle 20 may additionally include the first door 30 which opens and closes the discharge port 22 for discharging the cover tape 2 when the receptacle 20 is substantially filled with the cover tape 2. The receptacle 20 may additionally include the second door 60 disposed to form a certain angle with respect to the first door 30.

The first and second doors 30 and 60 may include or be formed of a metal material or a synthetic resin material. The first and second doors 30 and 60 may be hinged to the receptacle 20 at one side to be pivotally opened or closed. The first and second doors 30 and 60 may be pivotally coupled to the frame 10 which constitutes the receptacle 20. The first door 30 may be hinged to the lower sidewall 24 of the receptacle 20 to be vertically closed, and the second door 60 may be hinged to the upper sidewall 23 of the receptacle 20 to be horizontally closed.

The fastening member 40 may be installed between the first and second doors 30 and 60 to automatically open the first and second doors 30 and 60 depending on the inner pressure caused by the cover tape 2 received in the receptacle 20. The free ends of the first and second doors 30 and 60 may be fastened by the fastening member 40. The fastening member 40 may determine an inner pressure caused by the cover tape 2 in the receptacle 20 which is required to open the first door 30.

The fastening member 40 may be coupled to the frame 10 to be disposed at a lower part of the free end of the second door 60. The free end of the first door 30 may be vertically installed at the receptacle to be fastened to the fastening member 40. Therefore, when the first and second doors 30 and 60 are disposed to form a right angle, the fastening member 40 may have a rectangular cross-section. Likewise, when the first and second doors 30 and 60 are disposed to form an angle of 60°, the fastening member 40 may have a triangular cross-section. The fastening member 40 may have various shapes such as polygonal and circular shapes depending on the disposition of the first and second doors 30 and 60.

Typically, the first door 30 is vertically fastened to the fastening member 40, and the second door 60 is fastened to the fastening member 40 at the free end of the second door 60. Therefore, when an inner pressure is applied to the first door 30, the first door 30 may separate from the fastening member 40 to open the receptacle 20, and when an inner pressure is applied to the second door 60 in a direction other than that of the inner pressure applied to the first door 30, the second door 60 may separate from the fastening member 40 to open the receptacle 20.

The fastening member 40 may include a permanent magnet to provide a constant fastening force. In order to provide the fastening force corresponding to the permanent magnet, the first door 30 and/or the second door 60 may include iron or a magnetic body, or may include a fastening block formed of iron or a magnetic body disposed at a position corresponding to the permanent magnet. In some embodiments, the fastening member 40 may include a fabric hook-and-loop fastener tape (e.g., VELCRO) fastened to the first door 30 and/or the second door 60. In additional embodiments, the fastening member 40 may include dot (snap) buttons.

Hereinafter, operation of the second exemplary tape feeder 200 will be described with reference to FIGS. 5 through 7. Description of basic operations of the tape feeder 200 will be omitted and discharge of the cover tape 2 will be described in detail.

First, the tape feeder 200 may supply components 4 and separate the cover tape 2 from the carrier tape 1. As the components 4 are supplied, the cover tape 2 separated from the carrier tape 1 may pass through the discharge passage 15 to be received in the receptacle 20 via the first and second rotary bodies 11 and 12. The cover tape 2 may be folded in a vertical zigzag manner as shown in FIG. 6, or be folded in a lateral zigzag manner as shown in FIG. 7.

When the cover tape 2 is substantially folded in a vertical zigzag manner as shown in FIG. 6, the cover tape 2 may apply a certain inner pressure to the first door 30. While there is also a pressure applied upward and downward, the upward and downward pressure is typically smaller than the pressure applied to the first door 30.

When the inner pressure applied to the first door 30 is larger than a fastening force by which the first door 30 is fastened with the fastening member 40, the inner pressure applied to the first door 30 may overcome the fastening force of the fastening member 40 to open the first door 30. After the first door 30 is opened, the cover tape 2 received in the receptacle 20 may be automatically discharged to the exterior of the receptacle 20. An operator may recognize that the first door 30 is opened, rapidly remove the cover tape 2 received in the receptacle 20, and then close the first door 30.

When the cover tape 2 is substantially folded in a lateral zigzag manner as shown in FIG. 7, the cover tape 2 may apply a certain inner pressure in a direction other than that of the inner pressure applied to the first door 30. While there may be a pressure applied laterally (i.e., rightward and leftward), the lateral pressure may be smaller than the pressure applied in a vertical direction.

The vertically applied inner pressure may raise the second door 60. Consequently, the raised second door 60 may overcome the fastening force of the fastening member 40 to be separated therefrom. Thereafter, the cover tape 2 received in the receptacle 20 may be automatically discharged to the exterior of the receptacle 20 through the opening provided by the raised second door 60. An operator may recognize that the second door 60 has opened, rapidly remove the cover tape 2 received in the receptacle 20, and then close the second door 60. When the inner pressure is simultaneously applied to the first and second doors 30 and 60, the first and second doors 30 and 60 may be simultaneously opened.

Figure 8:
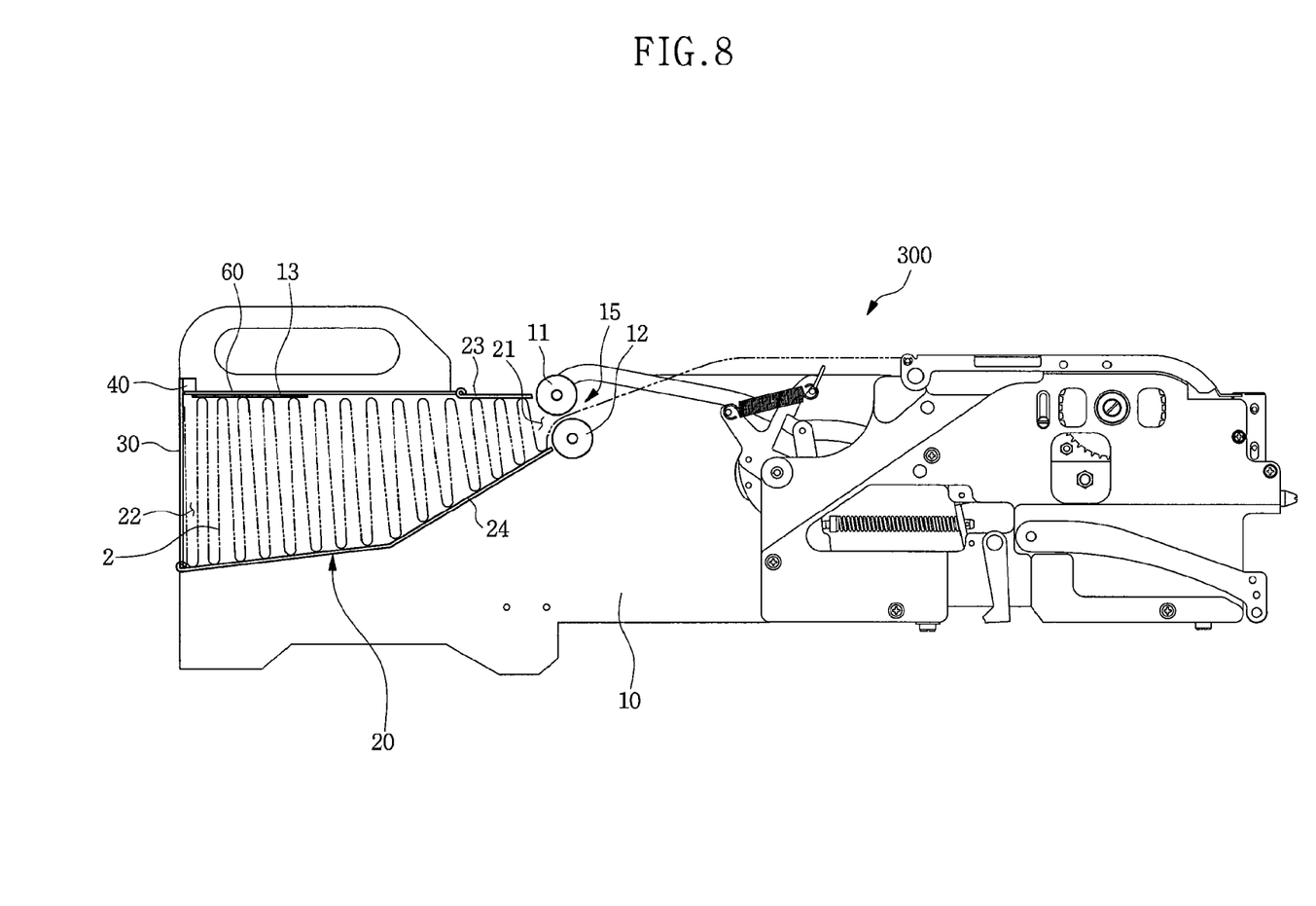
FIG. 8 is a side view of a third exemplary tape feeder showing a receptacle thereof.
Figure 9:
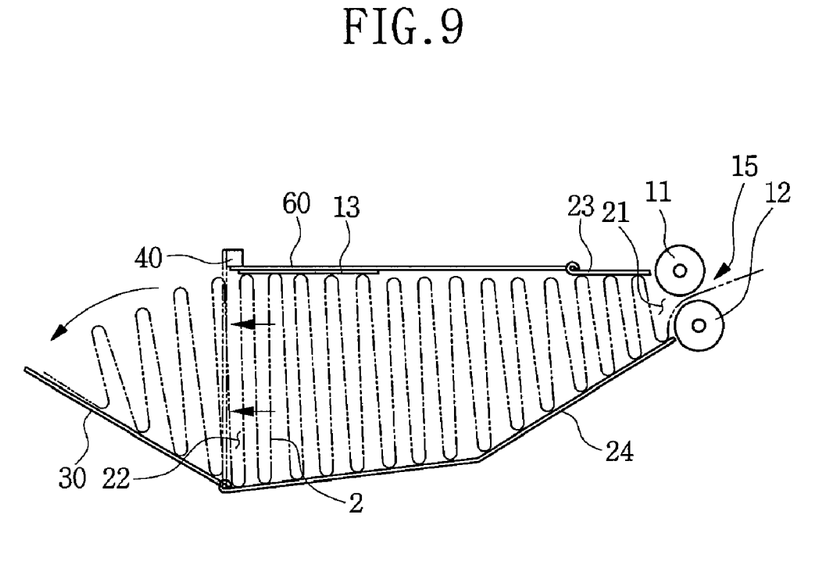
FIGS. 9 and 10 are views showing open and closed states of the third exemplary tape feeder.
Figure 10:
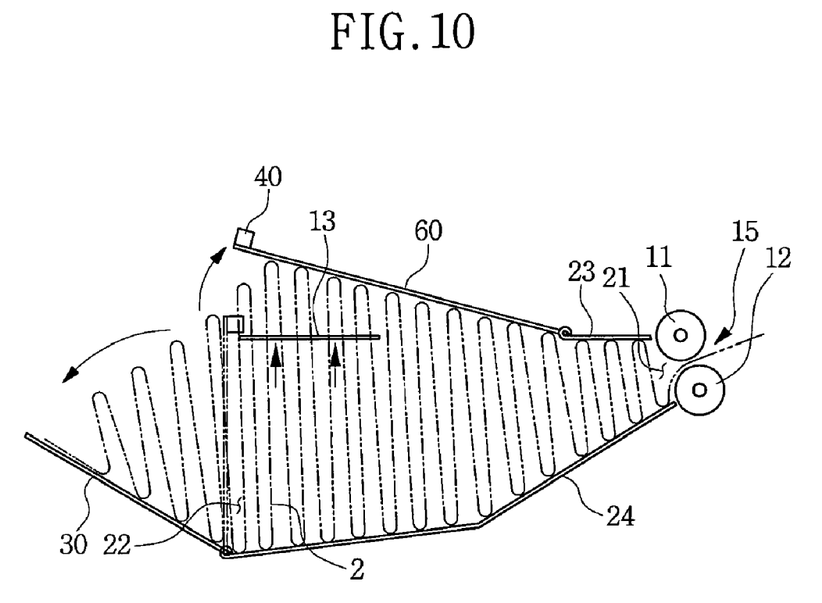

Hereinafter, a third exemplary tape feeder 300 will be described with reference to FIGS. 8 to 10. FIG. 8 is a side view of the third exemplary tape feeder 300 showing a receptacle thereof. FIGS. 9 and 10 are views showing open and closed states of the third exemplary tape feeder 300.

The tape feeder 300 may include a first door 30 and a second door 60. The tape feeder 300 may also include a fastening member 40 installed at one of the first and second doors 30 and 60 which simultaneously fastens the first and second doors 30 and 60.

A receptacle 20 having a predetermined space may be provided at a position in which a cover tape 2 is discharged by first and second rotary bodies 11 and 12. The receptacle 20 may have a space with a width larger than a width of the carrier tape 1 or the cover tape 2. In addition, an upper sidewall 23 may be formed at an upper part of the receptacle 20 and a lower sidewall 24 may be formed at a lower part of the receptacle 20 to provide the predetermined space therebetween.

The receptacle 20 may include an inlet port 21 into which the cover tape 2 is introduced by the first and second rotary bodies 11 and 12, and a discharge port 22 through which the cover tape 2 is discharged when the receptacle 20 is filled with a certain amount of the cover tape 2.

The receptacle 20 may additionally include the first door 30 which opens and closes the discharge port 22 for discharging the cover tape 2 when the receptacle 20 is substantially filled with the cover tape 2. The receptacle 20 may additionally include the second door 60 disposed to form a certain angle with respect to the first door 30. The certain angle may range from 0 degrees to 15 degrees, to 30 degrees, to 45 degrees, to 60 degrees, to 75 degrees, to 90 degrees, or up to 180 degrees.

The first and second doors 30 and 60 may include or be formed of a metal material or a synthetic resin material. The first and second doors 30 and 60 may be hinged to the receptacle 20 at one side to be pivotally opened or closed. The first door 30 may be hinged to a lower sidewall 24 of the receptacle 20 to be vertically closed, and the second door 60 may be hinged to an upper sidewall 23 of the receptacle 20 to be horizontally closed.

The fastening member 40 may be installed between the first and second doors 30 and 60 to automatically open the first and second doors 30 and 60 depending on the inner pressure caused by the cover tape 2 received in the receptacle 20. The free ends of the first and second doors 30 and 60 may be fastened by the fastening member 40. The fastening member 40 may determine an inner pressure caused by the cover tape 2 in the receptacle 20 which is required to open the first door 30.

The fastening member 40 may be coupled to a lower part of the free end of the second door 60. The free end of the first door 30 may be vertically installed at the receptacle 20 to be fastened to the fastening member 40. The fastening member 40, which may be coupled to the second door 60, may project therefrom to be in contact with the first door 30. Therefore, when the first and second doors 30 and 60 are disposed to form a right angle, the fastening member 40 may have a rectangular cross-section. Likewise, when the first and second doors 30 and 60 are disposed to form an angle of 60°, the fastening member 40 may have a triangular cross-section. The fastening member 40 may have various shapes such as polygonal and circular shapes depending on the disposition of the first and second doors 30 and 60.

In order to prevent sagging of the second door 60 due to its own weight, a support part 13 may be provided at the frame 10. The support part 13 may include a projection or a step formed at the frame 10 constituting a lower part of the second door 60. Typically, the second door 60 may be hooked by the support part 13, and the first door 30 may be vertically fastened to the fastening member 40. When an inner pressure is applied to the first door 30, the first door 30 may separate from the fastening member 40 to open the receptacle 20. When an inner pressure is applied to the second door 60, the second door 60 may separate from the fastening member 40 to open the receptacle 20. The first door 30 may separate from the fastening member 40 together with and/or in addition to the second door 60.

The fastening member 40 may include a permanent magnet to provide a constant fastening force. In order to provide the fastening force corresponding to the permanent magnet, the first door 30 may include iron or a magnetic body, or may include a fastening block formed of iron or a magnetic body disposed at a position corresponding to the permanent magnet. In some embodiments, the is fastening member 40 may include a fabric hook-and-loop fastener tape (e.g., VELCRO) fastened to the first door 30 and/or the second door 60. In additional embodiments, the fastening member 40 may include dot (snap) buttons.

Hereinafter, operation of the third exemplary tape feeder 300 will be described with reference to FIGS. 8 through 10. Description of basic operations of the tape feeder 300 will be omitted and discharge of the cover tape 2 will be described in detail.

First, the tape feeder 300 may supply components 4 and separate the cover tape 2 from the carrier tape 1. As the components 4 are supplied, the cover tape 2 separated from the carrier tape 1 may pass through the discharge passage 15 to be received in the receptacle 20 via the first and second rotary bodies 11 and 12. The cover tape 2 may be folded in a vertical zigzag manner as shown in FIGS. 9 and 10, or be folded in a lateral zigzag manner (as shown elsewhere, e.g., in FIGS. 4 and 7).

When the cover tape 2 is substantially folded in a vertical zigzag manner as shown in FIG. 9, the cover tape 2 may apply a certain inner pressure to the first door 30. While there is also a pressure applied upward and downward, the upward and downward pressure is typically smaller than the pressure applied to the first door 30.

When the inner pressure applied to the first door 30 is larger than a fastening force by which the first door 30 is fastened with the fastening member 40, the inner pressure applied to the first door 30 may overcome the fastening force of the fastening member 40 to open the first door 30. After the first door 30 is opened, the cover tape 2 received in the receptacle 20 may be automatically discharged to the exterior of the receptacle 20. An operator may recognize that the first door 30 is opened, rapidly remove the cover tape 2 received in the receptacle 20, and then close the first door 30.

As shown in FIG. 10, the cover tape 2 may also apply a certain inner pressure in a direction other than that of the inner pressure applied to the first door 30, such as vertically. Although the lateral (i.e., rightward and leftward) pressure applied by the cover tape 2 may be smaller than the vertical pressure, the vertically applied pressure may raise the second door 60. The raised second door 60 may overcome the fastening force of the fastening member 40 to be separated therefrom. Since the first door 30 may also be separated from the fastening member 40 as the second door 60 is separated therefrom, when the vertical pressure is applied to the second door 60, both the first and second doors 30 and 60 may be simultaneously opened. Thereafter, the cover tape 2 received in the receptacle 20 may be automatically discharged to the exterior of the receptacle 20 through either or both openings provided by the first and second doors 30 and 60. An operator may recognize that both the first and second doors 30 and 60 are opened, rapidly remove the cover tape 2 received in the receptacle 20, and then close the first and second doors 30 and 60.

Figure 11:
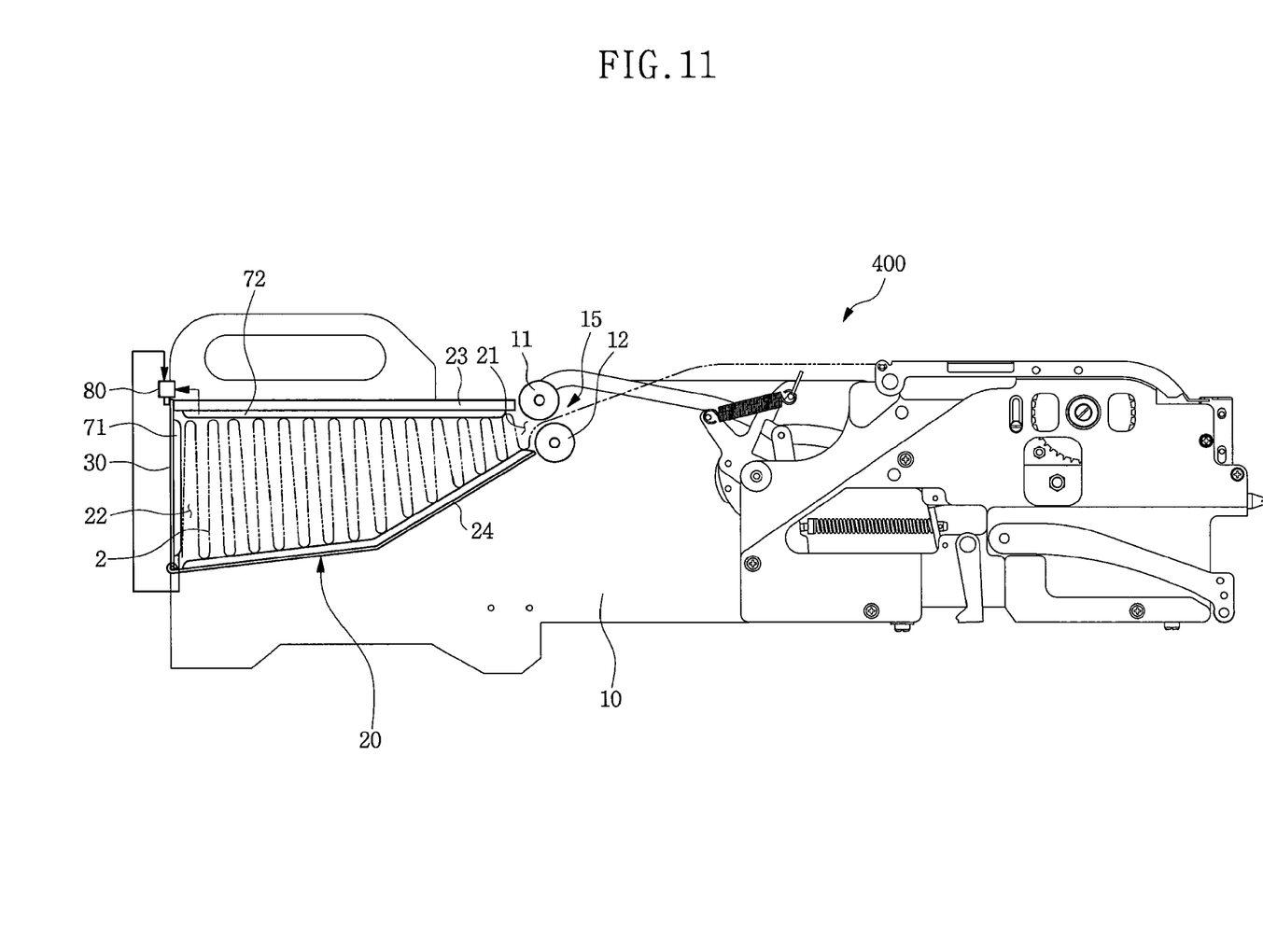
FIG. 11 is a side view of a fourth exemplary tape feeder, showing a receptacle thereof.
Figure 12:
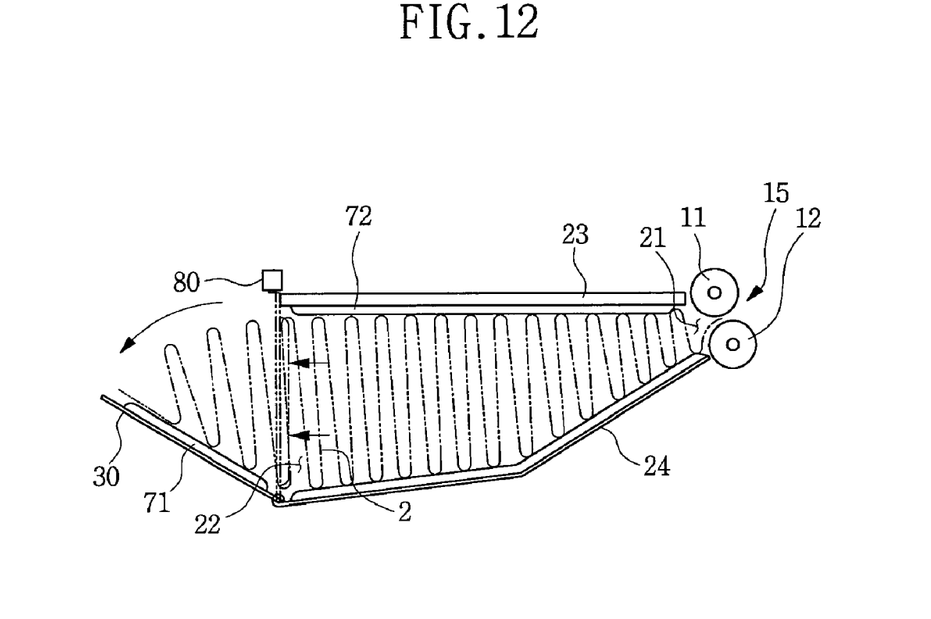
FIGS. 12 and 13 are views showing open and closed states of the fourth exemplary tape feeder.
Figure 13:
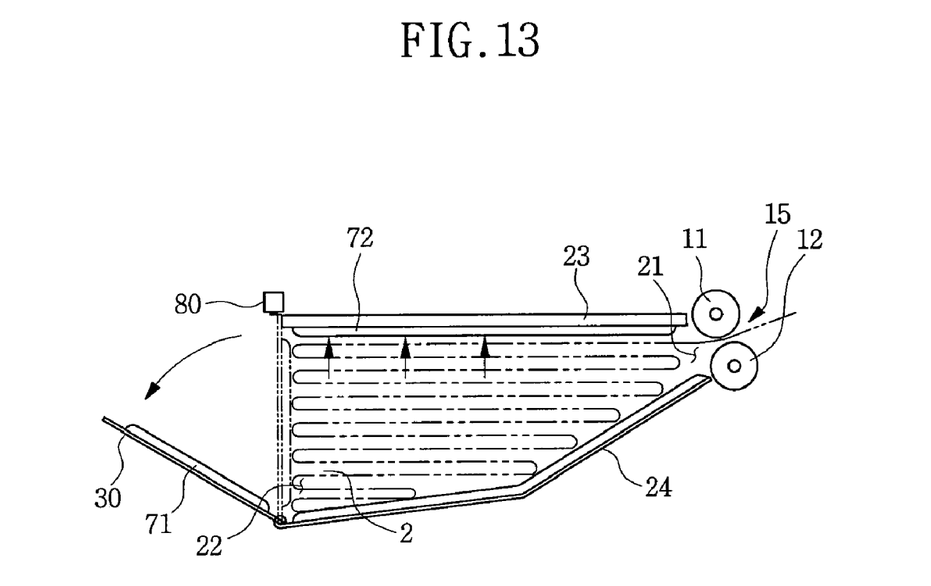

Hereinafter, a fourth exemplary tape feeder 400 will be described with reference to FIGS. 11 through 13. FIG. 11 is a side view of the fourth exemplary tape feeder 400 showing a receptacle 20 thereof. FIGS. 12 and 13 are views showing open and closed states of the fourth exemplary tape feeder 400.

The tape feeder 400 may include a first door 30, a pressure sensor installed at an inside of the tape feeder 400, and a locking member 80 which may open the first door 30 depending on an input signal. The pressure sensor may detect an inner pressure of the receptacle 20, and may provide the input signal to the locking member 80 based on the detected inner pressure of the receptacle 20.

The receptacle 20 having a predetermined space may be provided at a position in which a cover tape 2 is discharged by first and second rotary bodies 11 and 12. The receptacle 20 may have a space with a width larger than a width of the carrier tape 1 or the cover tape 2. In addition, an upper sidewall 23 may be formed at an upper part of the receptacle 20 and a lower sidewall 24 may be formed at a lower part of the receptacle 20 to provide the predetermined space.

The receptacle 20 may include an inlet port 21 into which the cover tape 2 is introduced by the first and second rotary bodies 11 and 12, and a discharge port 22 through which the cover tape 2 is discharged when the receptacle 20 is filled with a certain amount of the cover tape 2. The receptacle 20 may additionally include the first door 30 which opens and closes the discharge port 22 to discharge the cover tape 2 when the receptacle 20 is substantially filled with the cover tape 2.

The first door 30 may include or be formed of a metal material or a synthetic resin material. The first door 30 may be hinged to the lower sidewall 24 of the receptacle 20 at one side to be pivotally opened and closed. The first door 30 may be pivotally coupled to the frame 10 constituting the receptacle 20.

The locking member 80 may be installed at the frame 10 such that the first door 30 may be automatically opened depending on an inner pressure caused by the cover tape 2 received in the receptacle 20. A free end of the first door 30 may be locked by the locking member 80. The locking member 80 may determine whether to lock and/or release the first door 30. The locking member 80 may include a solenoid.

The pressure sensor installed at the inside of the tape feeder 400 may include a plate-type pressure sensor installed in the receptacle 20. The pressure sensor may detect an even inner pressure of a certain region to control the locking member 80 to lock and/or release the first door 30 when the even inner pressure is detected. The pressure sensor may include a first pressure sensor 71 installed at the first door 30, and a second pressure sensor 72 installed at an inner upper sidewall 23 of the receptacle 20.

Hereinafter, operation of the fourth exemplary tape feeder 400 will be described with reference to FIGS. 11 to 13. Description of basic operations of the tape feeder 400 will be omitted and discharge of the cover tape 2 will be described in detail.

First, the tape feeder 400 may supply components 4 and separate the cover tape 2 from the carrier tape 1. As the components 4 are supplied, the cover tape 2 separated from the carrier tape 1 may pass through the discharge passage 15 to be received in the receptacle 20 via the first and second rotary bodies 11 and 12. The cover tape 2 may be folded in a vertical zigzag manner as shown in FIG. 12, or be folded in a lateral zigzag manner as shown in FIG. 13.

When the cover tape 2 is substantially folded in a vertical zigzag manner is as shown in FIG. 12, the cover tape 2 may apply a certain inner pressure to the first door 30. While there is also a pressure applied upward and downward, the upward and downward pressure is typically smaller than the pressure applied to the first door 30.

When the inner pressure applied to the first door 30 is larger than a fastening force of the first door 30, the first pressure sensor 71 may detect the inner pressure and control the locking member 80 to open the first door 30.

After the first door 30 is opened, the cover tape 2 received in the receptacle 20 may be automatically discharged to the exterior of the receptacle 20. An operator may recognize that the first door 30 is opened, rapidly remove the cover tape 2 received in the receptacle 20, and then close the first door 30.

When the cover tape 2 is substantially folded in a lateral zigzag manner as shown in FIG. 13, the cover tape 2 may apply a certain inner pressure in a direction other than the inner pressure applied to the first door 30, such as vertically. While there may be a pressure applied laterally (i.e., rightward and leftward), the lateral pressure may be smaller than the pressure applied in a vertical direction. The second pressure sensor 72 may detect the vertically applied inner pressure to control the locking member 80. When the second pressure sensor 72 detects that the vertically applied inner pressure exceeds a fastening force, the second pressure sensor 72 may control the locking member 80 to open the first door 30. After the first door 30 is opened, the cover tape 2 received in the receptacle 20 may be automatically discharged to the exterior of the receptacle 20. An operator may recognize that the first door 30 is opened, rapidly remove the cover tape 2 received in the receptacle 20, and then close the first door 30.

As can be seen from the foregoing, since a lever coupled to a fastening member may be hinged to a door to be operated regardless of an application direction of an inner pressure of a receptacle, the door may be automatically opened when the inner pressure is a predetermined value or higher. Furthermore, a first door and a second door may be selectively opened depending on an application direction of the inner pressure of the receptacle. Since one or both of the doors may be opened regardless of the direction of the inner pressure, it is possible to reduce errors upon supply of components.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated. It will be recognized that the terms "comprising," "including," and "having," as used herein, are specifically intended to be read as open-ended terms of art.

What is claimed is:

1. A tape feeder for supplying components to a component mounter via a carrier tape on which the components are disposed at predetermined intervals and covered with a cover tape, the tape feeder comprising:
    a frame including a receptacle, the receptacle having
        an inlet port for receiving the cover tape separated from the carrier tape,
        a space for containing the cover tape received through the inlet port, and
        a first door opening through which the cover tape is discharged;
    a first door configured to open or close the first door opening; and
    an opening/closing member configured to fasten the first door closed and thereafter open the first door when an inner pressure of at least a fastening force is applied by the cover tape received in the receptacle, wherein the opening/closing member comprises:
        a lever hinged to an inner upper sidewall of the receptacle at one end of the lever; and
        a fastening member disposed at an opposite end of the lever, the fastening member maintaining a closed state of the first door while the inner pressure is less than the fastening force.

2. The tape feeder according to claim 1, wherein the lever is hinged to the frame disposed at an inner upper part of the receptacle.

3. The tape feeder according to claim 1, wherein the fastening member includes a permanent magnet.

4. The tape feeder according to claim 1, wherein the fastening member includes a hook-and-loop fastener tape.

5. The tape feeder according to claim 1, wherein the lever comprises a locking part locked by a corner of the receptacle at the opposite end of the lever.

6. The tape feeder according to claim 1, wherein the first door is hinged to the frame to be pivotally opened with respect to the receptacle.

7. The tape feeder according to claim 1, wherein the lever has both ends vertically bent upward to have different lengths, and a long end of the lever is hinged to the inner upper sidewall of the receptacle and a short end of the lever is coupled to the fastening member.

8. The tape feeder according to claim 7, wherein the short end the lever passes between the first door and the discharge port of the receptacle to be exposed to the exterior of the receptacle and coupled to the fastening member.

* * * * *